United States Patent [19]

Mehta

[11] Patent Number: 5,679,599

[45] Date of Patent: Oct. 21, 1997

[54] ISOLATION USING SELF-ALIGNED TRENCH FORMATION AND CONVENTIONAL LOCOS

[75] Inventor: Sunil Mehta, San Jose, Calif.

[73] Assignee: Advanced Micro Devices, Inc., Sunnyvale, Calif.

[21] Appl. No.: 493,640

[22] Filed: Jun. 22, 1995

[51] Int. Cl.[6] .................................................. H01L 21/76
[52] U.S. Cl. ................................ 437/69; 437/70; 437/67; 437/72
[58] Field of Search ............................. 437/67, 69, 70, 437/72, 73

[56] References Cited

U.S. PATENT DOCUMENTS

| | | | |
|---|---|---|---|
| 4,892,614 | 1/1990 | Chapman et al. | 437/67 |
| 4,994,406 | 2/1991 | Vasquez et al. | 437/67 |
| 5,130,268 | 7/1992 | Liou et al. | 437/72 |
| 5,438,016 | 8/1995 | Figura et al. | 437/67 |
| 5,472,904 | 12/1995 | Figura et al. | 437/67 |
| 5,498,566 | 3/1996 | Lee | 437/67 |

OTHER PUBLICATIONS

Park, et al., "Self–Aligned LOCOS/Trench (SALOT) Combination Isolation Technology Planarized by Chemical Mechanical Polishing", IEDM Technology Digest, pp. 675–678, 1994.

*Primary Examiner*—Trung Dang
*Attorney, Agent, or Firm*—Fliesler, Dubb, Meyer & Lovejoy LLP

[57] ABSTRACT

A method for isolating regions of a circuit device in a semiconductor substrate. The method generally comprises the steps of: forming a first insulation region and a second insulation region; etching a trench in the first insulation region, the trench extending into the semiconductor substrate to a depth below the surface of the semiconductor substrate; filling the first isolation region with an isolation material and removing a portion of the isolation material such that the trench isolation material fills the trench and has a surface level with the surface of the substrate; and thermally growing a field oxide in the first and second isolation regions. In a further aspect, a semiconductor device is provided. The device is formed on a semiconductor substrate, the substrate having a surface and includes at least a first, second, and third active regions separated by first and second insulating regions. The first insulation region separates the first and second active regions, and includes a first portion extending a first depth into the semiconductor substrate and having a width, and a second portion extending a second depth into the semiconductor substrate and having a second width. In the first insulating region, the first depth is greater than the second depth and the first width is smaller than the second width. The second insulating region separates the second and third active regions, and has a third width and extending a third depth below the surface of the semiconductor substrate, the third depth being substantially the same as said second depth.

28 Claims, 6 Drawing Sheets

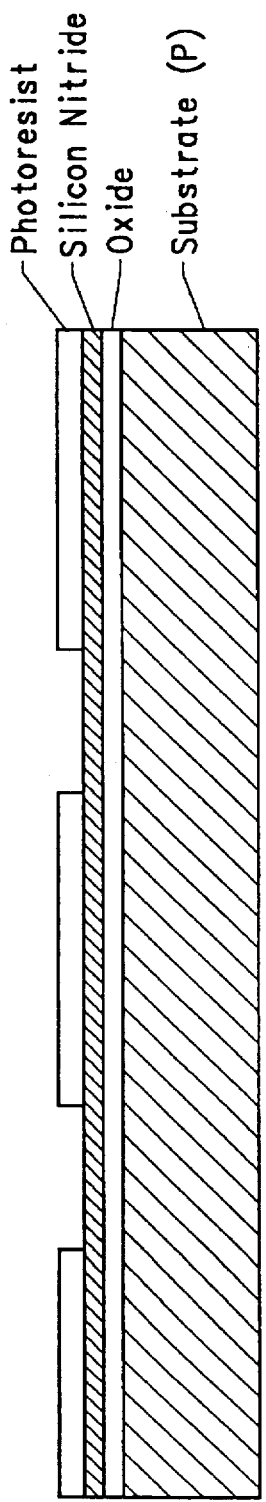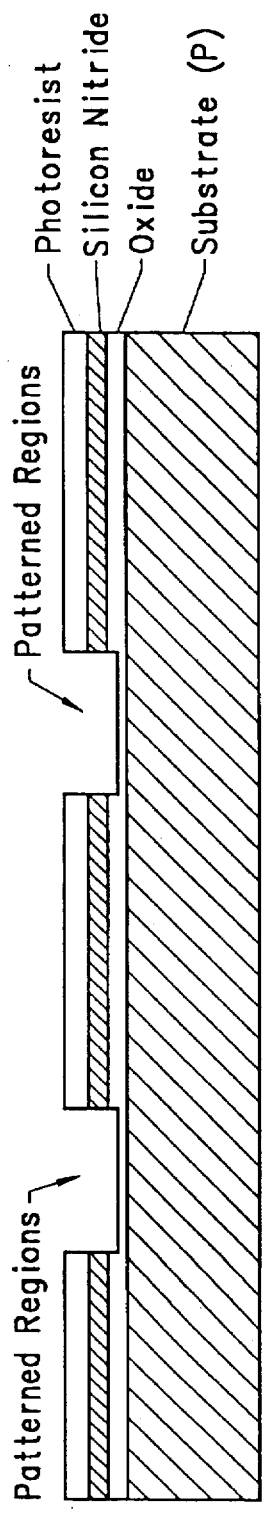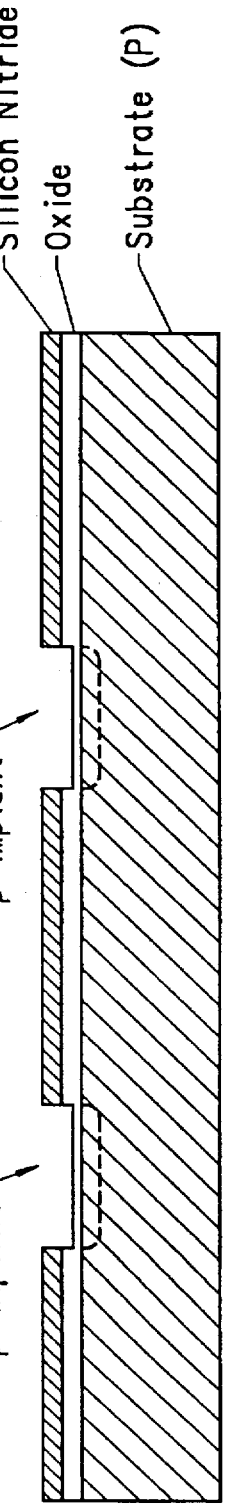
FIG. 1 (PRIOR ART)
FIG. 2 (PRIOR ART)
FIG. 3 (PRIOR ART)

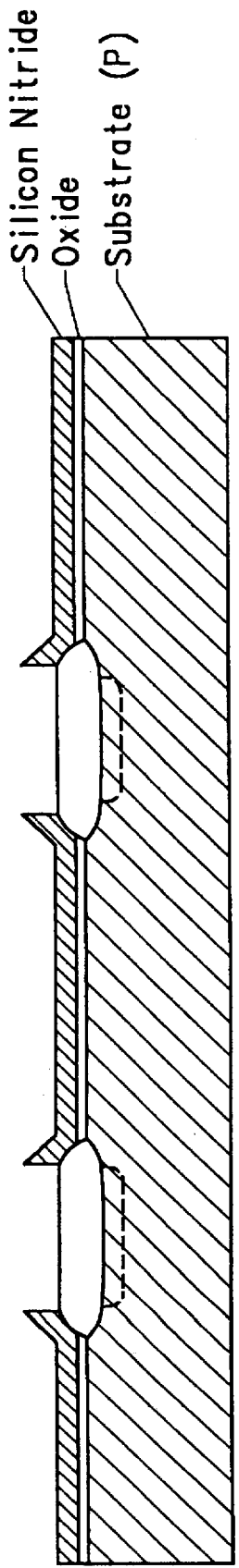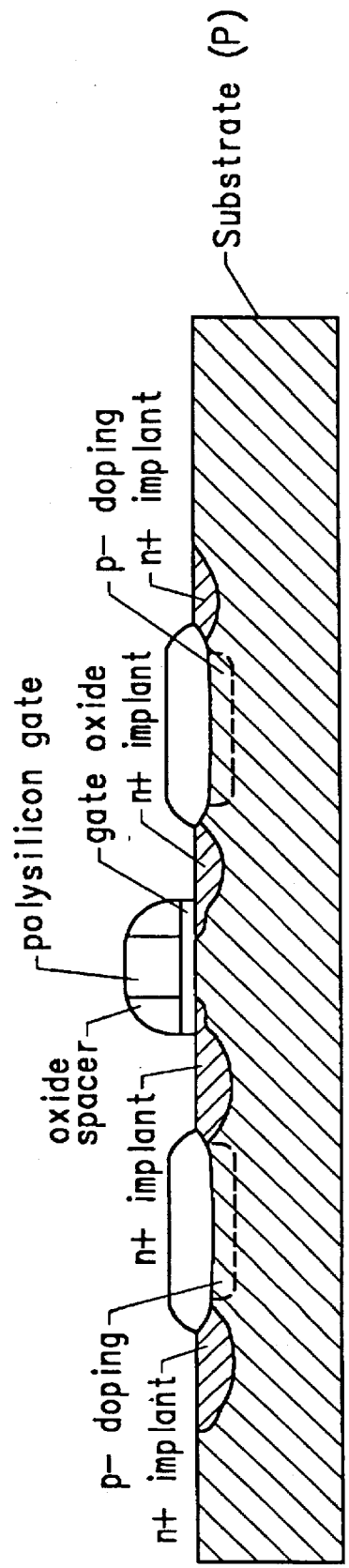
FIG. 4
(PRIOR ART)
FIG. 5
(PRIOR ART)

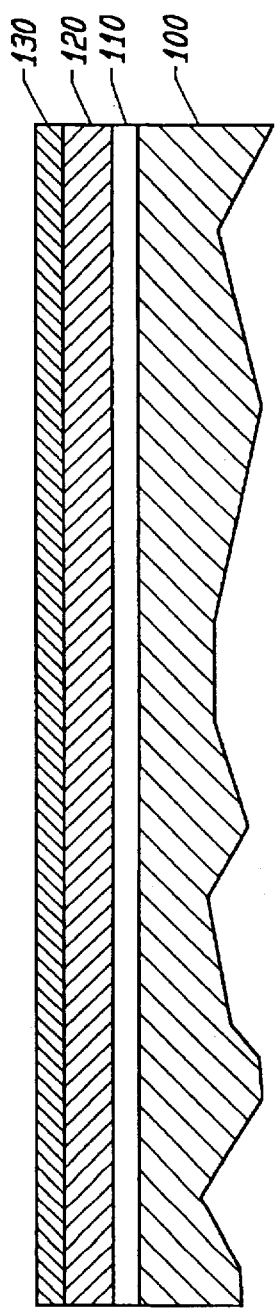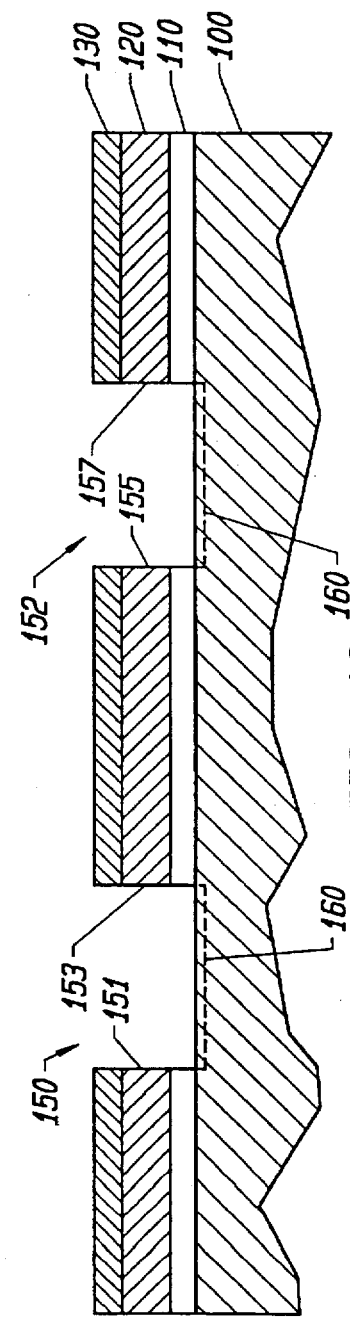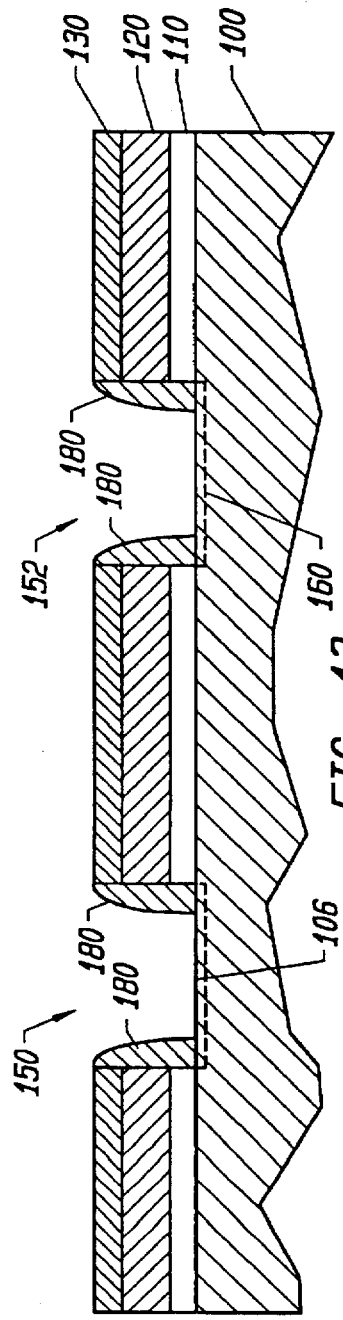

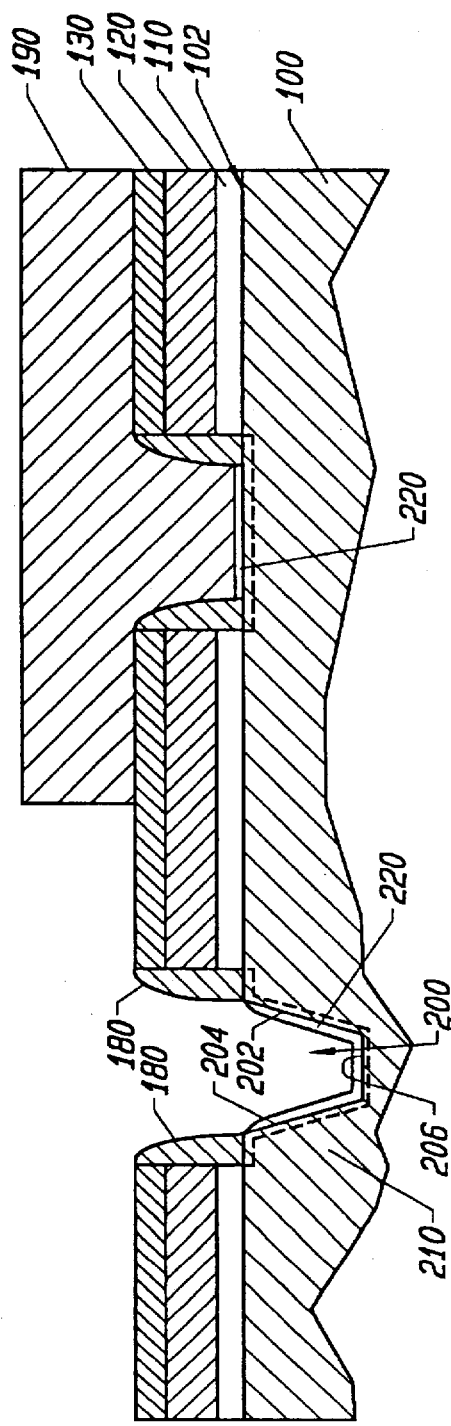
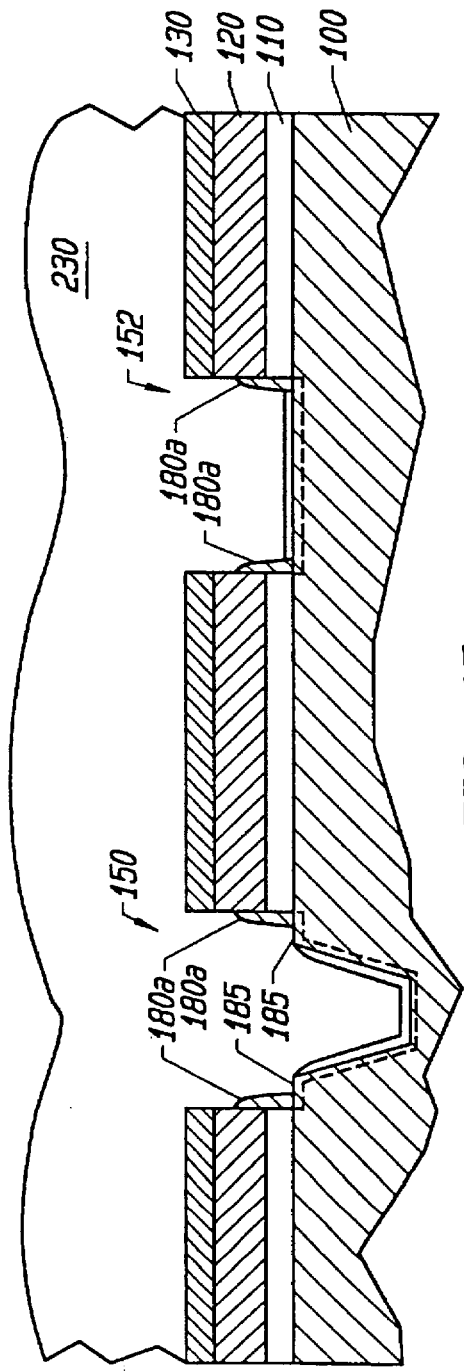
FIG. 14
FIG. 15

ISOLATION USING SELF-ALIGNED TRENCH FORMATION AND CONVENTIONAL LOCOS

BACKGROUND OF THE INVENTION

1. Field of the Invention

The invention relates to isolating active regions in semiconductor devices, and specifically to trench isolation and local oxidation of silicon (LOCOS) isolation processes.

2. Description of the Related Art

In a typical integrated circuit, manufactured on a silicon wafer, the active devices making up the integrated circuit are divided through the use of electrically isolating material. Each of the active devices must be electrically isolated from the adjoining active region to prevent cross-over electrical effects between adjoining devices which would defeat overall operation of the circuit. Each active region is utilized by the integrated circuit manufacturer to form an active device, such as, in CMOS technology, an n-channel or a p-channel transistor. The devices are thereafter connected to a series of metal or metal-alloy interconnect structures to complete the integrated circuit device.

The processing characteristics of LOCOS regions are very well known in the art. Such regions have been in use for a long period of time and there is a great deal of knowledge in the manipulation of such processes.

There are relatively wide variations in LOCOS processes which are utilized to provide isolation between active devices in fabricating integrated circuit products. LOCOS involves growing silicon dioxide by heating an exposed area of silicon (or silicon covered with a thin layer of silicon dioxide) in an oxygen containing ambient. Prior to LOCOS growth, the wafer construct will normally be covered with an inert layer of material, such as silicon nitride ($Si_3N_4$), and the nitride layer patterned to expose the areas selected for LOCOS formation. In many respects, this technology has been described in publications for almost thirty (30) years.

FIGS. 1-5 show cross-sections of a wafer in a conventional LOCOS process. It should be noted that not all process steps are shown in the figures, but only a general representation of the wafer cross-section at key points in the process.

In FIG. 1, a monocrystalline silicon substrate having a predetermined concentration of a p or n-type impurities is provided. (For convenience, the process is described with reference to fabrication of an NMOS transistor in a p-type substrate.) A thin layer of silicon dioxide, having a thickness in a range of 100 Å–500 Å (200 Å typical, depending on the technology) is grown on the surface of the silicon wafer. This layer is generally provided by heating the substrate in a dry oxygen atmosphere at a temperature in the range of 800°–1000° C. (900° C. typical), for a given period of time which depends upon the thickness of the layer desired.

A layer of silicon nitride is deposited to a thickness in a range of about 1000 Å to 2000 Å. The silicon nitride layer will be used as a control layer for the local oxidation process. Typically, the nitride layer and underlying oxide layer have thicknesses in a ratio of 5-10:1, respectively. (Typical values would be a 1400 Å layer of nitride with a 250 Å layer of oxide.)

A conventional photoresist process is then utilized to pattern the silicon nitride layer. A photoresist layer is deposited over the silicon nitride, a masking step performed to expose the photoresist layer and, depending on the type of photoresist (typically a positive acting resist) the exposed or unexposed portions of the photoresist are removed. This step completes the structure shown in FIG. 1.

In FIG. 2, the silicon nitride layer is then patterned using, for example, a reactive ion etch to expose the underlying oxide layer formed in step 2. During this portion of the process, the silicon nitride layer is completely removed in the exposed area, and part of the underlying oxide layer in the exposed area is also removed. Note that some of the oxide still remains.

In FIG. 3, the photoresist layer is then removed, leaving the silicon nitride layer as the uppermost layer on the substrate. Prior to or after removal of the photoresist layer, if desired, a light field implant of a material having the same impurity type as the substrate may be performed in the exposed regions. In FIG. 3, this implant may, in general, comprise a p− implant of a dopant such as Boron (B) in a concentration of $2 \times 10^{13}$ $cm^{-2}$, at an energy in the range of 30 keV. This field implant yields an impurity concentration of about $10^{17}$ $cm^{-3}$ in the substrate.

In FIG. 4, the localized region of isolation oxide is then grown in the exposed area. In general, this step may be performed at a very high temperature in the range of about 800° C.–1200° C. The LOCOS oxide grows above the surface of the silicon substrate and forces the edges of the silicon nitride layer upward in the regions adjacent to the LOCOS region, resulting in the so-called "bird's beak" effect.

In FIG. 5, the nitride layer is removed, typically using a wet etch process. A brief, additional oxidation is often carried out in order to fully remove residual materials at the field oxide edge.

A gate structure, including a polysilicon gate and gate oxide, is then formed over the silicon substrate. First, a gate oxide layer is grown on the underlying silicon substrate. The gate oxide layer thickness will depend greatly on the size of the technology. Following gate oxide layer growth, a polysilicon or polycide layer is deposited on the gate oxide, and then is masked and etched. An n− implant may be (optionally) made to form lightly-doped drain (LDD) regions adjacent to the gate structure, and oxide spacers may then be formed. A heavy n-type implant is then made to form the active regions of the device. The n+ implant can be performed by using Arsenic in a concentration in the range of $5.0 \times 10^{15}$ $cm^{-2}$, at an implantation energy of 50 keV.

Because LOCOS processes generally occupy a great deal of wafer surface area, alternative isolation structures have been developed. One such process is shallow trench isolation, which involves etching a trench into the substrate, and filling the trench with an insulation material. However, shallow trench isolation (STI) is relatively complex because an anisotropic etch must be used to define the trench, the trench must be etched deeply into the silicon, and filling the trench with the isolation material can raise additional processing issues in preparing the integrated circuit. STI also results in relatively sharp corners at the edges of the trench at the silicon surface. This can result in electric field leakage at these corners and gate oxide quality problems.

An alternative to the STI process is described in Park, et al., SELF-ALIGNED LOCOS/TRENCH (SALOT) COMBINATION ISOLATION TECHNOLOGY PLANARIZED BY CHEMICAL MECHANICAL POLISHING, IEDM Technology Digest, pp. 675–678, 1994. FIGS. 6 through 10 show the SALOT process.

As shown in FIG. 6, a layer of pad oxide is provided on the surface of the silicon substrate, over which a layer of polysilicon and a layer of silicon nitride are provided. The pad oxide is formed to a thickness of approximately 11 nanometers, the polysilicon layer to a thickness of approximately 70 nanometers, and the silicon nitride to a thickness of approximately 200 nanometers. The stack is defined in a manner conventional to the poly-buffered LOCOS process, and the field oxide is grown at approximately 1050° C. The LPCVD polysilicon layer is deposited to a thickness of approximately 100 nanometers, and the polysilicon spacers are formed by the anisotropic etching process. Isolation regions are then etched into the nitride polysilicon oxide stack, and poly-buffered LOCOS isolation is grown in the etched regions. As shown in FIG. 7, polysilicon spacers are thereafter formed, a photoresist covers the structure and a photolithography and etch step isolates the isolation region into which a trench is to be formed. As shown in FIG. 8, anisotropic etching of the PBL oxide and substrate forms a trench, after which a thin oxide layer is grown on the trench sidewalls. The trench is then filled with a layer of CVD (chemical vapor deposition) oxide, the oxide passed through a densification step, and the surface of the structure planarized by chemical mechanical polishing (FIG. 9). Finally, the nitride and polysilicon layers are removed, yielding the structure shown in FIG. 10.

In the SALOT process, the trench etching is carried out in the DRAM cell array region where the isolation sizes are small. LOCOS isolation is provided in areas of the device where the size of the isolation is not as critical.

One of the major concerns in the SALOT and STI processes is the problem of dishing. Dishing is so named because of the tendency of the trench oxide to form a curvature at its surface which is centered at the area of the trench formation.

The SALOT process claims to have reduced the amount of dishing due to an initial surface profile which is relatively flat because of the thermal oxide in the wider region, and because of the use of the relatively narrow trenches in the SALOT process. However, the SALOT process requires a rather complex, two-step oxide/silicon etch to form the trench region. Further, filling of the deep trench region is rather difficult due to the high aspect ratio of the trench.

While such processes have provided good electrical characteristics in resulting devices, and yield improved isolation characteristics over that of conventional LOCOS isolation, the desire in the industry is to continue to improve such processes and to provide more effective isolation in such devices.

SUMMARY OF THE INVENTION

It is therefore an object of the invention to provide an improved isolation process for ultra-large-scale integration devices.

It is a further object of the invention to provide a process which is superior to local oxidation process in isolating devices.

Another object of the invention is to provide a process which provides significant advantages over shallow trench isolation and combination of shallow trench isolation and local oxidation processes.

Another object of the invention is to provide an isolation process which achieves the above objects and is compatible with poly-buffered LOCOS processes, recess LOCOS, and nitride encapsulated LOCOS.

These and other objects of the invention are provided, in a first aspect, in a method for isolating regions of a circuit device in a semiconductor substrate. The method generally comprises the steps of: forming a first insulation region and a second insulation region; etching a trench in the first insulation region, the trench extending into the semiconductor substrate to a depth below the surface of the semiconductor substrate; filling the first isolation region with an isolation material and removing a portion of the isolation material such that the trench isolation material fills the trench and has a surface level with the surface of the substrate; and thermally growing a field oxide in the first and second isolation regions.

In a further aspect, a semiconductor device is provided. The device is formed on a semiconductor substrate, the substrate having a surface and includes at least a first, second, and third active regions separated by first and second insulating regions. The first insulation region separates the first and second active regions, and includes a first portion extending a first depth into the semiconductor substrate and having a width, and a second portion extending a second depth into the semiconductor substrate and having a second width. In the first insulating region, the first depth is greater than the second depth and the first width is smaller than the second width. The second insulating region separates the second and third active regions, and has a third width and extending a third depth below the surface of the semiconductor substrate, the third depth being substantially the same as said second depth.

BRIEF DESCRIPTION OF THE DRAWINGS

The invention will be described with respect to the particular embodiments thereof. Other objects, features, and advantages of the invention will become apparent with reference to the specification and drawings in which:

FIGS. 1–5 are cross-sections of a silicon substrate showing the process steps utilized to form LOCOS regions in conventional LOCOS processing.

FIGS. 11–18 show the sequence process steps utilized in accordance with the isolation process of the present invention to achieve isolation in ultra-large-scale integration integrated circuits.

DESCRIPTION OF THE PREFERRED EMBODIMENTS

Figure 6:
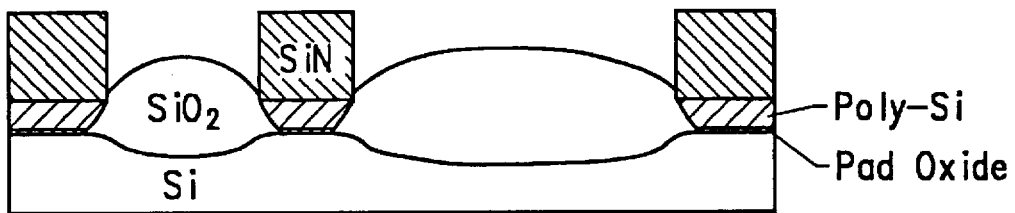
FIGS. 6–10 are cross-sections of a silicon device illustrating the process steps utilized in the SALOT process.
Figure 7:
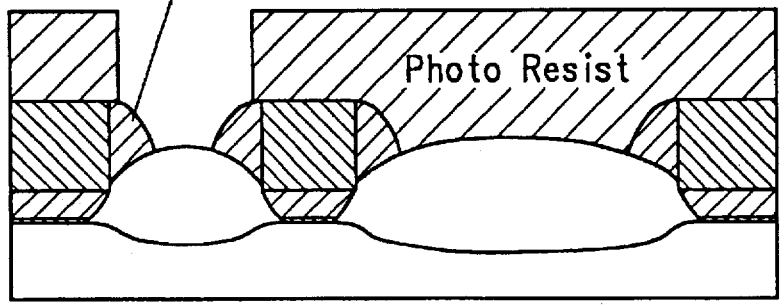
Figure 8:
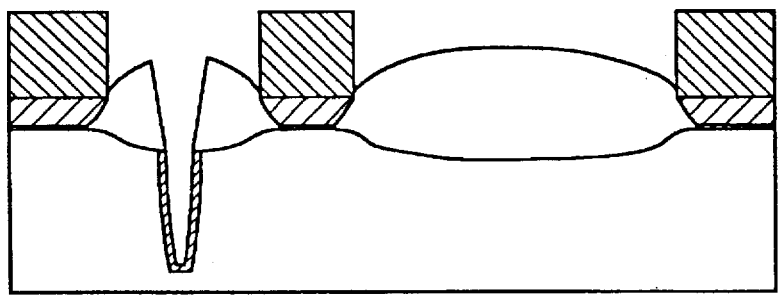
Figure 9:
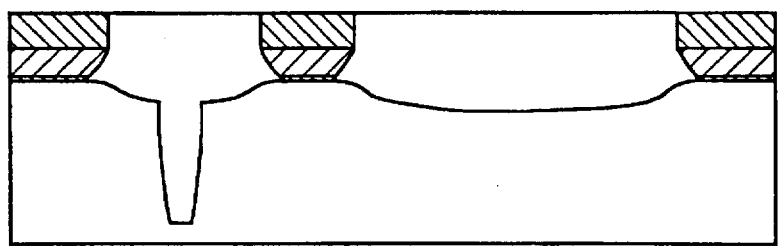
Figure 10:
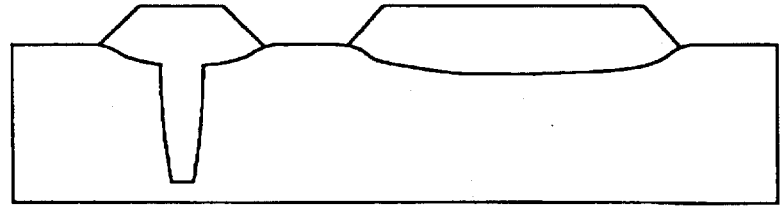

The invention described herein combines the well-known LOCOS isolation process and structure with a trench isolation process and structure wherein a field oxide is grown which simultaneously forms a portion of the LOCOS region and trench isolation structure. Through such combination, advantages attendant both technologies are employed. In the present invention, the trench isolation structure is needed in densely packed regions where the active spacing is small, such as, for example, a memory array in a DRAM, SRAM, or EPROM.

FIG. 11 shows a semiconductor substrate 100 upon which a semiconductor device is to be formed. A pad oxide layer 110, a layer of nitride 120, and a second layer of oxide 130 are formed on the surface of substrate 100. The pad oxide 110 has a thickness of 200 Å and may be thermally grown at a temperature of approximately 900° Celsius for a period of 40 minutes. (Temperatures, times, and suggested processing technologies are provided throughout the context of this disclosure. It should be understood, however, that the particular times, temperatures and technologies may be varied in accordance with well-known principles of semiconductor processing, and that such variances are to be considered within the scope of the invention as defined in this disclosure.)

Nitride layer 120 is deposited on the surface of oxide 110 using a chemical vapor deposition process to a thickness of approximately 2,000 Å. Oxide layer 130 is deposited by a chemical vapor deposition process onto the surface of the nitride layer 120 to a thickness of approximately 1,000 Å.

As shown in FIG. 12, a photolithography step is then used to provide isolation regions 150, 152, where isolation material will be provided into substrate 100.

The photolithography step (not detailed with respect to FIG. 12) may include providing an active photo resist material on the surface of oxide layer 130, masking the photoresist layer, exposing the area above regions 150, 152 to radiation, and using an active etchant to remove the exposed areas, thereby yielding regions 150, and 152.

A separate masking step may then be utilized to provide a field implant 160 of an impurity material having the same conductivity type as the material which comprises the substrate (or a well region in which the active device between isolation regions 150, 152 is being formed).

As shown in FIG. 13, spacers 180 are then formed. Spacers 180 may be formed by depositing a spacer layer of nitride, oxynitride, oxide, or polysilicon, or onto the structure shown in FIG. 12 and spacers 180 formed by doing a spacer etch. The spacer layer of nitride, oxynitride, oxide, or polysilicon can be deposited utilizing a plasma-enhanced chemical vapor deposition process in accordance with well-known techniques to give better etching selectivity with respect to the CVD nitride mentioned above.

The nitride, oxynitride, oxide, or polysilicon spacer layer is then anisotropically etched to form spacers 180 on side-walls 151, 153, and 155, 157 of regions 150 and 152, respectively.

As shown in FIG. 14, a trench resist 190 is then applied to cover the structure, and patterned so that region 150 is exposed for a trench etch. (Region 150 could represent, for example, a memory cell array of an EPROM, SRAM, DRAM, or EEPROM). Trench 200 is then etched into substrate 100. (The width of the trench is exaggerated in FIG. 14 for clarity of the description.) A trench implantation step to provide an impurity 210, adjacent to trench walls 202, 204 and trench base 206, may then be performed. An oxide layer 220 is thereafter grown in trench 200.

The trench implant may be conducted by implanting impurity ions so that the direction of implantation is normal to the surface 102 of substrate 100. Alternatively, the implantation may be made so that the doping ions are implanted at angles non-normal to the surface 102 so that ion implantation into trench walls 202, 204 is improved.

Resist material 190 is thereafter stripped from the structure. At this point, spacers 180 may be etched to, for example, a partial level as shown in FIG. 15. FIG. 15 shows a spacer partially etched to form spacers 180a which leave a ledge 185 on the surface of substrate 100 adjacent to the trench. Oxide layer 110 will act as an etch stop during the spacer removal process. Alternatively, spacers 180 may be completely etched, or not etched at all, depending on the nature of the underlying structure to be formed in the integrated circuit, between the isolation regions 150, 152.

Subsequently, a layer of oxide material may be used to fill trench 200. Oxide layer 230 is shown in FIG. 15 and is deposited by a chemical vapor deposition process to a thickness more than sufficient to fill the trench. The deposition of the CVD oxide 230 into the trench region is relatively thin, since the trench has a relatively small aspect ratio, and thus no voids in oxide 230 result.

Figure 16:
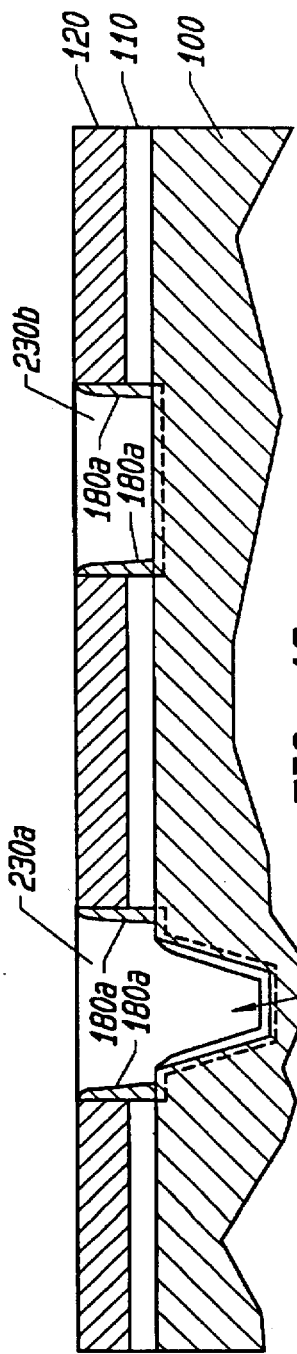

As shown in FIG. 16, oxide layer 230 is then removed by either chemical mechanical polishing down to the level of the surface of nitride layer 120, or by etching (such as a reactive ion etch process), thereby forming filled areas 230a and 230b (occupying regions 150 and 152 in the structure shown in FIG. 16). Oxide 230 is removed so that the upper surface 232 of the oxide 230 even with the surface of the nitride layer 120. It should be noted in FIG. 16 that the oxide layer 130 has been stripped or polished during the etching or chemical mechanical polishing step. It should be realized that the nitride layer 120 acts as an easily-removable stopping agent and mask in the process of the present invention.

Figure 17:
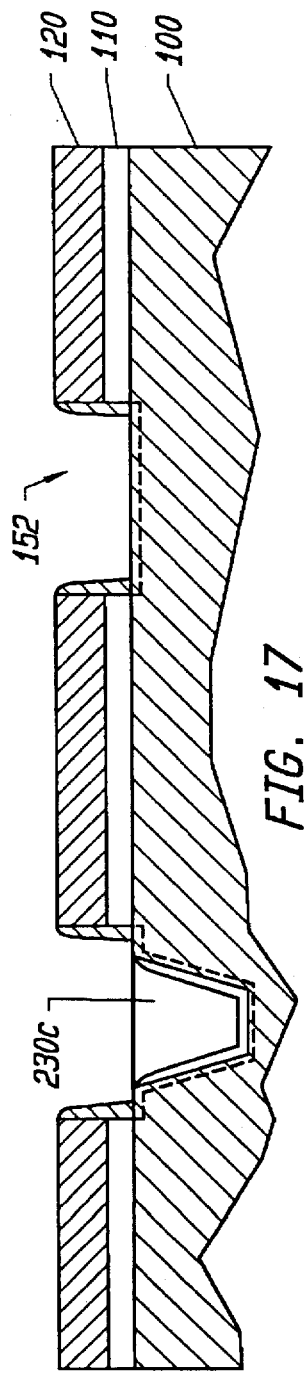

As shown in FIG. 17, the oxide regions 230a are then stripped or etched to the level of the silicon substrate 100. This leaves a filled trench region 230c as shown in FIG. 17.

Figure 18:
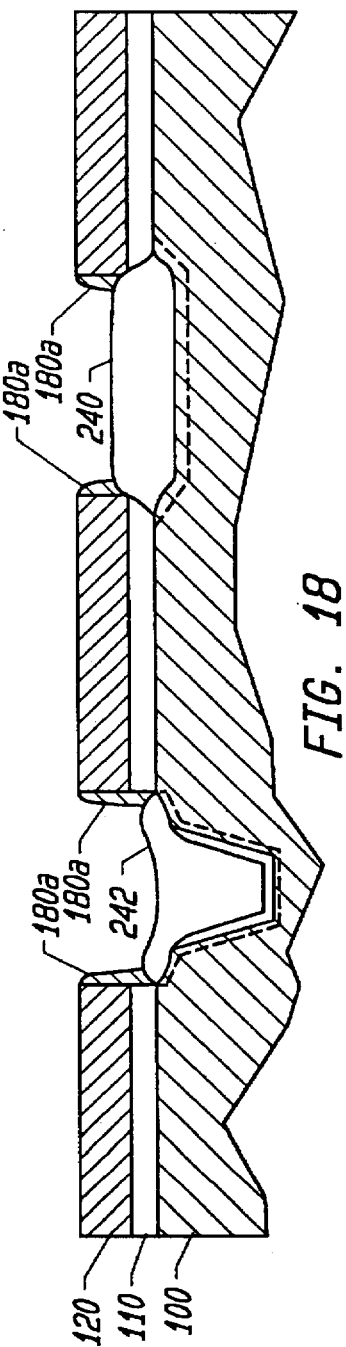

A field oxidation step, equivalent to that utilized in a conventional LOCOS process, may thereafter be performed yielding the combination isolation structure as shown in FIG. 18. As shown, a combination of a conventional LOCOS region 240 and field oxidized trench region 242 results.

There are several alternatives to the process which may be incorporated within the scope and spirit of the present invention. For example, a recessed LOCOS may be provided in region 152 as opposed to the standard LOCOS shown in FIG. 18. In this alternative, the stack etch, as shown in FIG. 12, is continued so that a portion of the substrate 100 in regions 150, 152 is removed. Processing then continues as described above. Because a trench is formed in region 150, the etch will have little effect on this region. However, the etch will result in the upper surface of the LOCOS region 240 in isolation region 152 being closer to the level of the surface of substrate 100.

A second alternative is to provide total, partial, or no nitride encapsulation of the LOCOS region. Partial nitride encapsulation is shown in FIG. 18; total nitride encapsulation occurs if spacers 180 are not etched back. No nitride encapsulation occurs if the spacers are etched off completely. Nitride encapsulation tends to reduce the bird's beak effect which is commonly seen in LOCOS processes.

In the Park, et al. paper, a polysilicon buffered LOCOS is shown. The method of the present invention supports the use of a polysilicon buffered LOCOS with the addition of a polysilicon layer between the oxide layer 110 and the nitride layer 120.

Finally, as noted above, a further alternative is the use of angled field implants in the implantation of trench 200 shown in FIG. 14 may be utilized.

The present invention also provides significant advantages over the standard LOCOS process, shallow trench isolation (STI), or the self-aligned LOCOS trench (SALOT) processes.

In LOCOS processes, it is generally difficult to scale the minimum spacing between devices because of short-channel effects, also known as punch-through. Using the isolation structure and method of the present invention, it is relatively easy to scale the minimum spacing between regions, utilizing the trench region 200 for areas of the integrated circuit where low MOS spacing is necessary. Where the LOCOS isolation is utilized in high voltage technologies, a relatively thick field oxide and heavy field implant is necessary. Because the field oxide layer is grown only in regions with large active spacing, the field oxide can be relatively thin and the field implant can be lighter since the minimum spacing areas have much deeper trench regions than LOCOS region 240.

In LOCOS processes, spacing between the heavily-doped n+ and p+ regions must be relatively large. Utilizing the trench regions in combination with the standard LOCOS process as shown in the instant disclosure, the n−region to p−region spacing can be reduced. In the LOCOS process, field oxide thinning occurs at low spacings between active devices. In combination with the trench region, no field oxide thinning at low spacing occurs. Significant encroachment or ΔW of the bird's beak region can reduce the effective area of the active region between the isolation areas. By incorporating nitride encapsulation in conjunction with the method and structure of the present invention, encroachment can be reduced. Finally, LOCOS generally results in a non-planar structure unless an etch of the silicon substrate is utilized to form recessed LOCOS regions. The structure and method of the present invention are compatible with recessed LOCOS regions, and provide the above advantages with the combination of a conventional LOCOS process which may be utilized in areas of the integrated circuit wherein small region spacing is not required.

Shallow trench isolation technology, although well-documented, is still replete with problems. In shallow trench isolation, the interface between the active and isolation regions is relatively new and unfamiliar. Thus, gate oxide leakage may occur. A significant advantage of the present invention is that it preserves the familiar and well-characterized interface between active regions and isolation regions in the LOCOS field. No edge oxide quality problems would therefore result.

Shallow trench isolation is subject to trench corner leakage. This effect can be seen in the trench/substrate corners (for example, formed by ledges 185 and sidewalls 204 and 202 of trench 200) where the electric field strength of an active device will be focused. As shown in FIG. 18, because of the field oxide growth, the ledge is essentially eliminated and the isolation structure of the present invention is not sensitive to trench corner leakage.

Shallow trench isolation can be subject to dishing causing thinning of the isolation in wide-trench regions. In the instant method and apparatus, no dishing occurs since only a narrow trench region is exposed to chemical mechanical polishing. Finally, in shallow trench isolation, a critical planarizing mask is generally needed to reduce such dishing. In the present method and apparatus, no such critical mask is needed.

Moreover, the method and apparatus of the present invention provides significant advantages over the SALOT process. The SALOT process is still subject to some field oxide dishing, although it is significantly less than in the shallow trench isolation processes (see FIG. 5 of the Park, et al. paper). In the instant process, any dishing during CMP of the oxide in the larger, non-trench region 152 does not cause thinning of the oxide because the field oxide is grown after the chemical mechanical polishing step.

In the SALOT process, a complicated two-step etch is necessary to form the trench region. The thick field oxide needs to be etched down. In the instant process, trench etching is relatively simple as only the silicon substrate 100 is etched. In the SALOT process, the oxide fill of the trenches is a relatively high aspect ratio and may form voids. In the instant process, the oxide fill of the trenches has a much smaller access ratio, thereby resulting in no voids.

In the SALOT process, an extra densification step for the trench oxide must be used. In the instant process, no additional trench oxide densification step is required. This is because the trench oxide is densified during field oxidation, thereby reducing the number of steps with respect to that shown in the SALOT process.

The SALOT process is generally not compatible with recessed LOCOS, whereas the instant process may, as discussed above, be utilized with recessed LOCOS.

The SALOT process further discloses the use of polysilicon spacers which are generally hard to remove. Utilization of the nitride spacers 180 (180a) incorporates a process which is relatively easy to implement.

Finally, the SALOT process can result in relatively high encroachment. Use of the nitride encapsulation option of the LOCOS region in the instant case will reduce nitride encapsulation in the current structure.

The many features and advantages of the present invention will be apparent to one of average skill in the art. All such features and advantages are intended to be within the scope of the invention as defined by the instant disclosure, the drawings, and the following claims.

What is claimed is:

1. A method for isolating regions of a circuit device in a semiconductor substrate, the substrate having a surface, comprising the steps of:

forming a first insulating layer on the surface of the substrate;

forming a layer of a nitride material on the first insulating layer, the nitride material having a surface;

forming a second insulating layer on the nitride material; and patterning the second insulating layer, nitride material and the first insulating layer to provide a first insulation region and a second insulation region by exposing a first and second portions of the surface of the substrate;

etching a trench in the first insulation region while the second insulation region being covered by a mask the trench extending into the semiconductor substrate to a depth below the surface of the semiconductor substrate;

filling the first isolation region with an isolation oxide and removing a portion of the isolation oxide such that the trench isolation material fills the trench and has a surface level with the surface of the substrate; and thermally growing a field oxide in the first and second isolation regions.

2. The method of claim 1 wherein the step of forming further comprises:

providing a field implantation mask on the second insulating layer;

implanting a dopant of the same impurity type into the surface portions of the substrate;

depositing a spacer material on the second insulating layer and said surface portions of the substrate; and etching a portion of the spacer material to form spacers overlying a portion of the surface potions of the substrate.

3. The method of claim 1 further including the step, following the step of forming a first insulating layer on the surface of the substrate, of:

forming a layer of polysilicon on the first insulating layer.

4. The method of claim 1 wherein the step of etching comprises patterning the exposed area with a trench mask to provide a trench etch region on said first insulation region;

etching said first insulation region to form a trench extending below the surface of the substrate.

5. The method of claim 4 wherein the step of etching further comprises implanting an impurity of said impurity type into the substrate.

6. The method of claim 4 wherein the step of etching further comprises forming a third insulating layer in the trench and on a second of the exposed portions of the substrate.

7. The method of claim 4 wherein the step of etching further comprises forming a third insulating layer in the trench and on said second isolation region; and etching at least a portion of the spacers.

8. The method of claim 7 wherein said portion comprises all of said spacers.

9. The method of claim 1 wherein the step of filling comprises:

depositing a fourth layer of insulating material over the second insulating layer, the spacers, and the third insulating layer;

removing a first portion of the fourth insulating layer and the second insulating layer to expose the surface of the nitride material thereby forming a planar surface; and etching a second portion of the fourth insulating layer to expose the second exposed portion of the substrate.

10. A method of making a semiconductor device, comprising the steps of:

(a) providing a substrate of a first impurity type, the substrate having a surface;

(b) forming a first insulating layer on the surface of the substrate;

(c) forming a layer of a nitride material on the first insulating layer, the nitride material having a surface;

(d) forming a second insulating layer on the nitride material;

(e) patterning the first insulating layer, nitride material and the second insulating layer to provide exposed portions of the substrate;

(f) providing a field implantation mask on the second insulating layer;

(g) implanting a dopant of the first impurity type into the exposed portions of the substrate;

(h) depositing a spacer material on the second insulating layer and said exposed portions of the substrate;

(i) etching a portion of the spacer material to form spacers overlying a portion of the exposed potions of the substrate;

(j) patterning the exposed area with a trench mask to provide a trench etch region on one of the exposed portions of the surface of the substrate;

(k) etching said one of said exposed portions of the substrate to form a trench extending below the surface of the substrate;

(l) implanting an impurity of the first type into the substrate;

(m) forming a third insulating layer in the trench and on a second of the exposed portions of the substrate;

(n) depositing a fourth layer of insulating material over the second insulating layer, the spacers, and the third insulating layer;

(o) removing a first portion of the fourth insulating layer and the second insulating layer to expose the surface of the nitride material;

(p) etching a second portion of the fourth insulating layer to expose the second exposed portion of the substrate; and (q) growing a field oxide in said second exposed region.

11. The method of claim 10 wherein said step (b) comprises thermally growing a layer of silicon dioxide on the surface of a substrate.

12. The method of claim 10 wherein said step (c) comprises depositing a nitride layer by chemical vapor deposition.

13. The method of claim 10 wherein said step (c) comprises depositing a layer of silicon nitride.

14. The method of claim 10 further including the step, between said steps (b) and (c), of forming a polysilicon layer on said first insulating layer.

15. The method of claim 10 wherein said step (d) comprises depositing said second insulating layer by chemical vapor deposition.

16. The method of claim 10 wherein said step (e) includes using an active photoresist material.

17. The method of claim 10 wherein said step (e) comprises depositing an active photoresist material on the surface of the second insulating layer, exposing the active photoresist material to radiation in selected regions, and etching said exposed regions to remove selected portions of the second insulating layer, nitride material, and first insulating layer.

18. The method of claim 10 wherein said step (f) comprises foxing a photoresist layer over the surface of the second insulating layer, patterning the photoresist by selectively exposing portions of the resist to radiation, and etching the resist to remove said selected portions.

19. The method of claim 10 wherein said step (h) includes depositing spacer material comprising a nitride.

20. The method of claim 10 wherein step (h) includes depositing spacer material comprising an oxide.

21. The method of claim 10 wherein step (h) includes depositing spacer material comprising an oxynitride.

22. The method of claim 10 wherein step (h) includes depositing spacer material comprising polysilicon.

23. The method of claim 10 wherein said step (k) comprises performing an anisotropic etch.

24. The method of claim 10 wherein said step (l) comprises implanting impurity ions in a direction normal to the surface of the substrate.

25. The method of claim 10 wherein said step (l) comprises implanting impurity ions in a direction non-normal with respect to the surface of the substrate.

26. The method of claim 10 including the step, between said steps (m) and (n) of etching at least a portion of the spacers.

27. The method of claim 25 wherein said step of etching comprises etching all of said spacers.

28. A method of isolating adjacent active regions in a semiconductor substrate, the substrate having a surface and being of a first conductivity type, comprising the steps of:

(a) forming a first insulating layer on the surface of the substrate;

(b) forming a layer of a nitride material on the first insulating layer (c) forming a second insulating layer on the nitride material (d) exposing at least a first and second portions of the substrate;

(e) implanting a first impurity type into the first and second portions of the substrate (f) forming spacers overlying a portion of the first and second exposed potions of the substrate;

(g) etching said first exposed portion of the substrate to form a trench extending below the surface of the substrate;

(h) implanting an impurity of said same type into the substrate and the trench;

(i) forming a third insulating layer in the trench and on said second exposed portion of the substrate;

(j) depositing a fourth layer of insulating material over the second insulating layer, the spacers, and the third insulating layer;

(k) removing a first portion of the fourth insulating layer and the second insulating layer to expose the surface of the nitride material;

(l) etching a second portion of the fourth insulating layer to expose the second exposed portion of the substrate; and (m) growing a field oxide in said second exposed region.

* * * * *

UNITED STATES PATENT AND TRADEMARK OFFICE
CERTIFICATE OF CORRECTION

PATENT NO. : 5,679,599
DATED : October 21, 1997
INVENTOR(S) : Sunil Mehta

It is certified that error appears in the above-identified patent and that said Letters Patent is hereby corrected as shown below:

Column 8, line 35, after "mask" insert a comma.

Column 8, line 54, after "surface" delete "potions" and insert therefor --portions--.

Column 9, line 49, after "exposed" delete "potions" and insert therefor --portions--.

Column 10, line 31, delete "foxing" and insert therefor --forming--.

Column 11, line 6, after "exposed" delete "potions" and insert therefor --portions--.

Signed and Sealed this

Tenth Day of November 1998

BRUCE LEHMAN

Attest:

Attesting Officer

Commissioner of Patents and Trademarks